United States Patent
Lim et al.

(10) Patent No.: US 10,622,539 B2
(45) Date of Patent: Apr. 14, 2020

(54) PIEZOELECTRIC ELEMENT WITH SPONGE STRUCTURE AND METHOD OF MANUFACTURING THE SAME

(71) Applicant: UNIVERSITY-INDUSTRY FOUNDATION, YONSEI UNIVERSITY, Seoul (KR)

(72) Inventors: Sang Woo Lim, Seoul (KR); Eun Seok Oh, Seoul (KR)

(73) Assignee: UNIVERSITY-INDUSTRY FOUNDATION, YONSEI UNIVERSITY, Seoul (KR)

(*) Notice: Subject to any disclaimer, the term of this patent is extended or adjusted under 35 U.S.C. 154(b) by 521 days.

(21) Appl. No.: 15/393,595

(22) Filed: Dec. 29, 2016

(65) Prior Publication Data
US 2017/0207381 A1 Jul. 20, 2017

(30) Foreign Application Priority Data
Jan. 19, 2016 (KR) .................. 10-2016-0006195

(51) Int. Cl.
| H01L 41/053 | (2006.01) |
| H01L 41/193 | (2006.01) |
| H01L 41/18 | (2006.01) |
| H01L 41/37 | (2013.01) |
| B05D 3/14 | (2006.01) |
| H01L 41/113 | (2006.01) |
| H01L 41/331 | (2013.01) |
| H01L 41/45 | (2013.01) |
| B05D 1/18 | (2006.01) |

(52) U.S. Cl.
CPC .............. *H01L 41/053* (2013.01); *B05D 3/14* (2013.01); *H01L 41/1132* (2013.01); *H01L 41/183* (2013.01); *H01L 41/193* (2013.01); *H01L 41/331* (2013.01); *H01L 41/37* (2013.01); *H01L 41/45* (2013.01); *B05D 1/185* (2013.01)

(58) Field of Classification Search
CPC . H01L 41/053; H01L 41/1132; H01L 41/183; H01L 41/193
See application file for complete search history.

(56) References Cited

FOREIGN PATENT DOCUMENTS

| JP | 5736186 B2 | 6/2005 |
| KR | 101538082 B1 | 7/2015 |

OTHER PUBLICATIONS

Office Action issued in Korean Application No. 10-2016-0006195, dated Aug. 16, 2016. This document was translated using Google Translate. Please contact the undersigned if a more detailed translation is required.
McCall, et al., "Piezoelectric Nanoparticle—Polymer Composite Foams", ACS Applied Materials & Interfaces, 6(2014), 2014, 19504-19509.

*Primary Examiner* — Derek J Rosenau
(74) *Attorney, Agent, or Firm* — Meunier Carlin & Curfman LLC (57) ABSTRACT

The present invention relates to a sponge type piezoelectric element and a method of manufacturing the same, and specifically, to a piezoelectric element that is provided in a sponge form and thus can implement all of compressibility, flexibility, and durability and diversely applied to a wearable piezoelectric element, a ferroelectric element, and a sensor.

6 Claims, 7 Drawing Sheets

PIEZOELECTRIC ELEMENT WITH SPONGE STRUCTURE AND METHOD OF MANUFACTURING THE SAME

CROSS-REFERENCE TO RELATED APPLICATION

This application claims priority under 35 USC § 119(a) of Korean Patent Application No. 10-2016-0006195 filed on Jan. 19, 2016, the subject matter of which is hereby incorporated by reference.

BACKGROUND

1. Field of the Invention

The present invention relates to a piezoelectric element with a sponge structure and a method of manufacturing the same. A national R&D program that supported the present invention is the University-Centered Lab Support Program of the Ministry of Science, ICT and Future Planning, and Report No. 2009-0093823, which is a Nano Science and Technology Research Institute (2/3; 3 steps) program, and was supported by the Industry-Academic Cooperation Foundation of Yonsei University as a managing organization. Also, a national R&D program that supported the present invention is the Individual Basic Science & Engineering Research Support Program of the Ministry of Education (basic research), and Report No. NRF-2016R1D1A1B03936347, which is a program for the development of materials for hybrid energy devices using PVDF-ZnO-Graphene complex (1/3), and was supported by the Industry-Academic Cooperation Foundation of Yonsei University as a managing organization.

2. Discussion of Related Art

Piezoelectricity is a technology in which electrical energy is generated by using mechanical energy such as pressure and vibration. Piezoelectricity refers to a phenomenon in which electrical energy flows to the outside as a result a change in the relative position of an ion having electrical properties in a piezoelectric material due to mechanical deformation (compression or tension) and thus a momentarily induced change in charge density at an interface between an electrode and a piezoelectric material. A piezoelectric element is a material having a characteristic in which electricity is generated due to induced polarization in a material when external mechanical pressure is applied or mechanical deformation occurs due to an external electric field. The most widely used material is $Pb(Zr, Ti)O_3$ (PZT).

This piezoelectric energy harvesting technology is relatively easy to design, does not require an external power source, and exhibits a high energy conversion characteristic. Also, it has advantages of enabling the supply of necessary electric power from everyday actions (breathing, walking, running, tapping, stretching, and the like) that are not utilized in the surroundings and generating less electronic noise. However, a general ceramic type piezoelectric energy element has poor sensitivity, flexibility, elasticity, and the like and thus is limited when applied to energy harvesting or a sensor using mechanical energy obtainable from humans and the environment. Also, PZT has reached a limitation due to problems such as large area, ultra-thinness, ultra-fineness, low-temperature processability, flexibility, and the like. Many researches on the use of a ferroelectric polymer that is related to piezoelectricity and pyroelectricity as a material for replacing PZT have progressed, and a representatively widely used ferroelectric polymer may be polyvinylidene fluoride (hereinafter, referred to as PVDF).

Therefore, there is an urgent need to develop a wearable piezoelectric element that can overcome a limitation in element deformation such as sensitivity, flexibility, elasticity, compressibility, and the like, all of which are disadvantages of a ceramic type piezoelectric element and that is appropriate for humans to wear by using PVDF.

PRIOR-ART DOCUMENT

[Patent Document] (Patent Document 1) US Patent Publication No. 2012-0187325.

SUMMARY OF THE INVENTION

The present invention is directed to providing a piezoelectric element with a sponge structure, which is not damaged by high-pressure or deformation, has excellent expansion and contraction properties, flexibility and durability, and can be applied to a wearable element and the like by extending a time during which voltage is generated in accordance with mechanical deformation, and a method of manufacturing the same.

In order to accomplish the above objective, the present invention provides a piezoelectric element with a sponge structure, which includes a foam with a sponge structure; and a piezoelectric material applied on the surface of the foam.

In addition, the present invention provides a method of manufacturing a piezoelectric element, which includes preparing a foam with a sponge structure; preparing a polyvinylidene fluoride (PVDF) solution; immersing the foam in the polyvinylidene fluoride (PVDF) solution; and performing electrical polarization.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

As the present invention allows for various changes and numerous embodiments, particular embodiments will be illustrated in the drawings and described in detail in the detailed description.

However, this is not intended to limit the present invention to specific embodiments, and it should be appreciated that all changes, equivalents, or substitutes within the spirit and technical scope of the present invention are included in the present invention.

It should be appreciated that the terms "include" or "have" used herein are merely intended to indicate that features, numbers, steps, operations, components, parts, or combinations thereof are present, and not intended to exclude a possibility that one or more other features, numbers, steps, operations, components, parts, or combinations thereof will be present or added.

Also, drawings attached to the present specification should be understood to be magnified or reduced for the sake of convenience of the description.

Hereinafter, the present invention will be described with reference to the accompanying drawings. The same reference numerals are used for the same or corresponding component even in different drawings, and redundant description thereof will be omitted.

Hereinafter, a piezoelectric element according to the present invention will be described in detail.

In one exemplary embodiment, a piezoelectric element according to the present invention may include a foam with a sponge structure; and a piezoelectric material applied on the surface of the foam.

Specifically, the piezoelectric element according to the present invention may have a structure in which the foam with a sponge structure is surrounded with the piezoelectric material, or the foam with a sponge structure is coated with a polymerizable piezoelectric material. Alternatively, the piezoelectric element may have a structure in which the foam with a sponge structure is impregnated with a polymerizable piezoelectric material, or the foam with a sponge structure is immersed in a polymerizable piezoelectric material.

The foam with a sponge structure may specifically refer to a sponge type polymer, and for example, may be one or more selected from the group consisting of a polydimethylsiloxane (hereinafter, referred to as PDMS) sponge, a urethane type sponge, and a rubber type sponge, but the present invention is limited thereto as long as the material can implement elasticity, expansion and contraction properties, and flexibility. The foam according to the present invention may act as a frame that maintains a sponge form. Also, the piezoelectric material applied thereon acts as a piezoelectric or ferroelectric material, and thus the piezoelectric element may act as a piezoelectric sponge or a ferroelectric sponge.

The piezoelectric element including the sponge type foam may be a sponge type piezoelectric element, specifically, a sponge element having piezoelectric and ferroelectric properties, and a piezoelectric sponge or a ferroelectric sponge.

In one exemplary embodiment, the piezoelectric element according to the present invention may satisfy a condition of the following Expression 1 when elasticity is evaluated.

$$1 \leq E_p \leq 1000 \qquad \text{[Expression 1]}$$

In Expression 1, $E_p$ refers to an elastic modulus of a piezoelectric element (1.5 cm×1.5 cm×1 cm) measured at 25±2° C., and a unit thereof is kPa.

Specifically, an elastic modulus of the piezoelectric element may be 3 to 800 kPa, 5 to 500 kPa, 10 to 200 kPa, 15 to 150 kPa, or 18 to 50 kPa.

When the piezoelectric element according to the present invention has an elastic modulus within these ranges, it is possible to implement improved compressibility and flexibility and to prevent performance degradation even when physical deformation is applied.

In one exemplary embodiment, the piezoelectric element according to the present invention may have an average pore diameter in a range of 10 to 1000 μm. Specifically, the average pore diameter may be in a range of 30 to 900 μm, 50 to 850 μm, 70 to 800 μm, 100 to 700 μm, 150 to 650 μm, 200 to 600 μm, 250 to 550 μm, or 300 to 500 μm. When a piezoelectric element with a sponge structure has an average pore diameter within these ranges, it is possible to implement improved output voltage even when pressure and physical deformation are applied.

In one exemplary embodiment, the foam according to the present invention may be one or more of polyethersulfone (PES), poly(methyl methacrylate) (PMMA), polyimide (PI), ethylene vinyl acetate (EVA), amorphous polyethylene terephthalate (APET), polypropylene terephthalate (PPT), polyethylene terephthalate glycol (PETG), polycyclohexylene dimethylene terephthalate (PCT), modified triacetyl cellulose (TAC), a cyclo-olefin polymer (COP), a dicyclopentadiene (DCPD) polymer, a cyclopentadiene (CPD) polymer, polyarylate (PAR), polyetherimide (PEI), a silicone resin, a fluoride resin and a modified epoxy resin, polystyrene (PS), polycarbonate (PC), polyurethane (PU), polybutylene terephthalate (PBT), and polyethylene terephthalate (PET).

In addition, the foam may be a polydialkylsiloxane such as polydimethylsiloxane, polydiethylsiloxane, polymethylethylsiloxane, and the like (two alkyl groups are the same or different from each other); a polyalkyl(aryl)siloxane; poly(dimethylsiloxanemethylsiloxane); a foam formed by polymerizing a plurality of silicon (Si) containing monomers; or the like. Among these, polydimethylsiloxane (PDMS) may be used.

In one exemplary embodiment, the piezoelectric material according to the present invention may be PVDF.

In one exemplary embodiment, PVDF according to the present invention may be β-phase or δ-phase. When PVDF is β-phase, a piezoelectric property may be exhibited, and when PVDF is δ-phase, a ferroelectric property may be exhibited.

The PVDF has four polymorphs referred to as α, β, γ, and δ-phases and generally is present as α-phase which is the most stable phase at room temperature and atmospheric pressure. However, since the α-phase has centro-symmetric symmetry and thus is non-polar, a phase transition is required to use α-phase PVDF as a piezoelectric element and a ferroelectric element. The β-phase exhibits a piezoelectric property and has the largest dipole moment, and thus β-phase PVDF may be used as a piezoelectric element. The δ-phase is the same polymer type as the α-phase but there is a different arrangement between polymers, and thus is polar.

Figure 2:
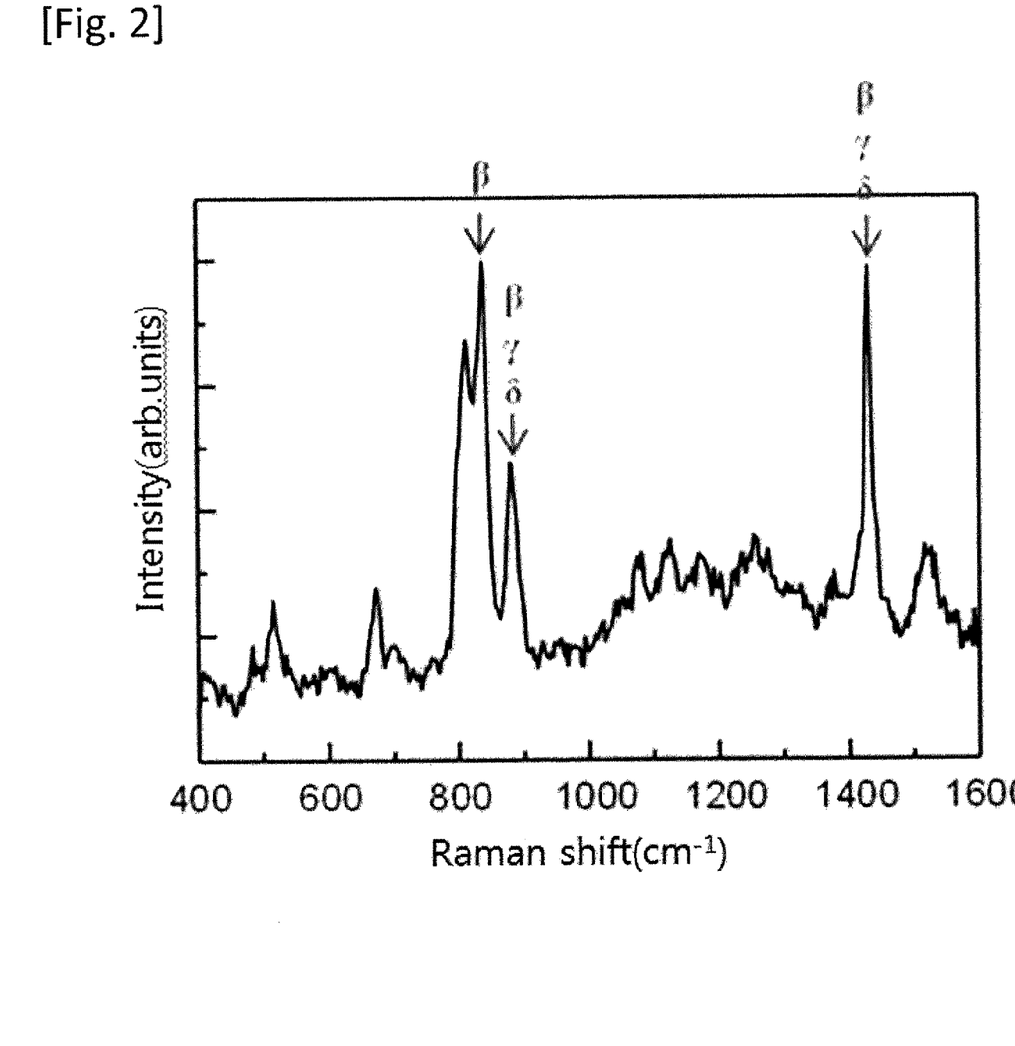
FIG. 2 is a Raman spectrum illustrating that PVDF applied on a piezoelectric sponge element manufactured according to the present invention exhibits the β-phase.

In one exemplary embodiment, the piezoelectric element according to the present invention may be a piezoelectric element. When PVDF of the piezoelectric element according to the present invention is β-phase, a piezoelectric property may be exhibited. Here, PVDF may be phase-transitioned to the β-phase by electrical polarization of a piezoelectric element including PVDF. FIG. 2 shows a Raman spectrum illustrating that the piezoelectric element according to the present invention exhibits the β-phase. Specifically, the piezoelectric element according to the present invention may be a piezoelectric sponge having elasticity, flexibility, and expansion and contraction properties.

Figure 3:
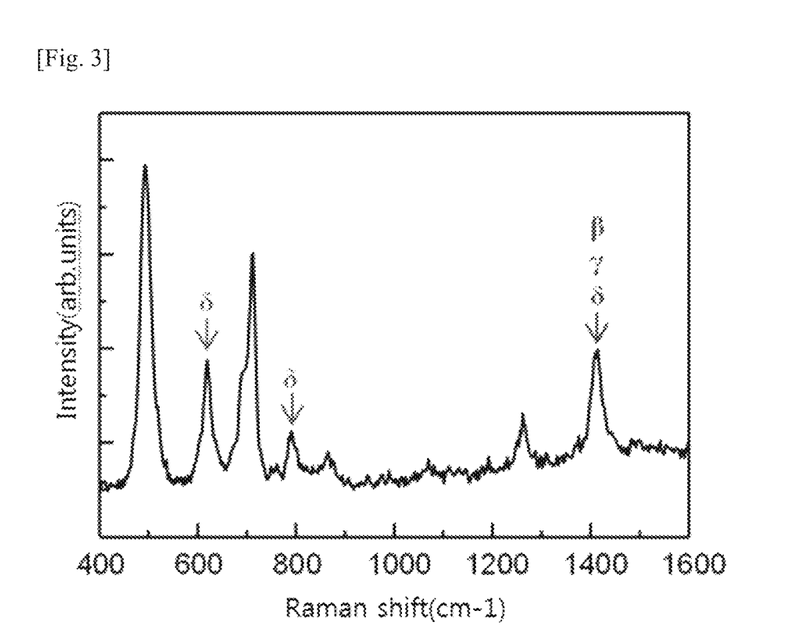
FIG. 3 is a Raman spectrum illustrating that PVDF applied on a ferroelectric sponge element manufactured according to the present invention exhibits the δ-phase.

In one exemplary embodiment, the piezoelectric element according to the present invention may be a ferroelectric element. When PVDF of the piezoelectric element according to the present invention is δ-phase, a ferroelectric property may be exhibited. Here, PVDF may be phase-transitioned to the δ-phase by electrical polarization of a piezoelectric element including PVDF. FIG. 3 shows a Raman spectrum illustrating that the ferroelectric element according to the present invention exhibits the δ-phase. Specifically, the ferroelectric element according to the present invention may be a ferroelectric sponge having elasticity, flexibility, and expansion and contraction properties.

In one exemplary embodiment, the piezoelectric element according to the present invention may have output voltage of 50 to 350 mV when PVDF is β-phase. Specifically, a piezoelectric element whose PVDF is β-phase may be a piezoelectric element, and the piezoelectric element may have output voltage in a range of 50 to 350 mV, 70 to 300 mV, or 100 to 280 mV.

Figure 7:
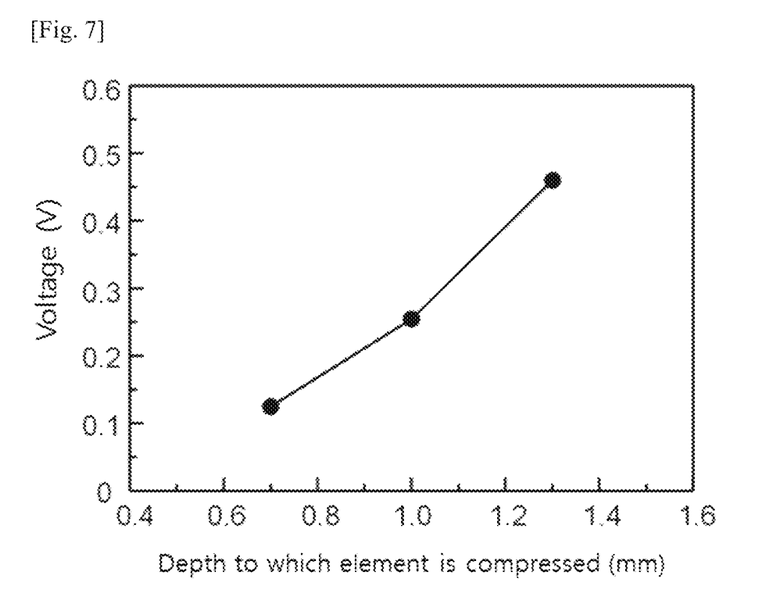
FIG. 7 is a graph illustrating a change in output voltage based on a change in the depth to which a piezoelectric sponge element according to Example 3 of the present invention is compressed.

In one exemplary embodiment, the piezoelectric element according to the present invention may have output voltage of 100 to 520 mV, 120 to 500 mV, or 200 to 480 mV when compressed about 1.3 mm. Referring to Experimental Example 4 according to the present invention and FIG. 7, it can be seen that the more the piezoelectric element is compressed, the higher output voltage is.

In one exemplary embodiment, the piezoelectric element according to the present invention may have output voltage of 2 to 100 mV when PVDF is δ-phase. Specifically, a piezoelectric element whose PVDF is δ-phase may be a ferroelectric element, and the ferroelectric element may have output voltage in a range of 5 to 90 mV, 10 to 80 mV, or 30 to 80 mV.

Figure 10:
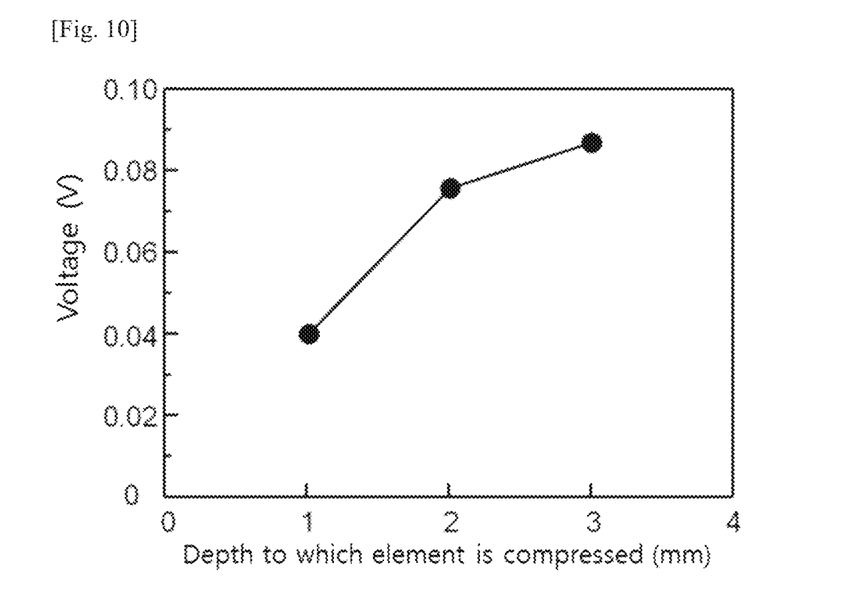
FIG. 10 is a graph illustrating a change in output voltage based on a change in the depth to which a piezoelectric sponge element according to Example 6 of the present invention is compressed.

In one exemplary embodiment, the ferroelectric element according to the present invention may have output voltage of 30 to 100 mV, 40 to 95 mV, or 50 to 90 mV when compressed about 3 mm. Referring to Experimental Example 7 according to the present invention and FIG. 10, it can be seen that the more a ferroelectric element is compressed, the higher output voltage is.

In one exemplary embodiment, the piezoelectric element according to the present invention may have a height of 1 to 20 mm or 3 to 15 mm. Specifically, the piezoelectric sponge according to the present invention may have a height of 2 to 10 mm and the ferroelectric sponge according to the present invention may have a height of 5 to 15 mm.

Hereinafter, a method of manufacturing a piezoelectric element according to the present invention will be described in detail.

A method of manufacturing a piezoelectric element according to the present invention may include preparing a foam with a sponge structure; preparing a PVDF solution; immersing the foam in the PVDF solution; and performing electrical polarization.

In one exemplary embodiment, the operation of preparing a foam with a sponge structure may include performing a templating process. In this case, a surface area per unit area may be varied based on the type of template used, and the templating process may be suitably selected from a sugar-templating process, a salt-templating process, or a polystyrene-templating process. The templating process may be performed without specific limitation as long as a material can be dissolved in water or a solvent rather than sugar, salt, and polystyrene. For example, sugar, salt, or polystyrene may be used. Specifically, a sugar-templating process may be performed in the present invention. In this case, a particle size of sugar may be 300 to 700 μm or 400 to 500 μm.

Specifically, the operation of preparing a foam with a sponge structure may include preparing a mixed solution of a prepolymer as a polymer and a thermal curing agent in a volume ratio of 10:1; preparing an absorber by immersing sugar in the mixed solution and progressing absorption for 1 to 3 hours; removing the absorber and curing the same on a hot plate at 40 to 90° C. for 15 to 30 hours; and removing sugar by putting the cured absorber in water at room temperature and performing ultrasonic disintegration.

In the preparation method according to the present invention, a polymer may be a polydialkylsiloxane such as polydimethylsiloxane, polydiethylsiloxane, polymethylethylsiloxane, and the like (two alkyl groups are the same or different from each other); a polyalkyl(aryl)siloxane; poly(dimethylsiloxanemethylsiloxane); a polymer formed by polymerizing a plurality of silicon (Si) containing monomers; or the like. Among these, polydimethylsiloxane (PDMS) may be used.

In the preparation method according to the present invention, a thermal curing agent may be obtained on the market for use, and the present invention is not limited as long as there is no problem when a polymer is prepared.

In one exemplary embodiment, the operation of preparing a PVDF solution may include dissolving a PVDF powder in a solvent at a concentration of 5 to 50 wt %. In this case, the solvent may be at least one mixture selected from the group consisting of dimethyl sulfoxide (DMSO), dimethylformamide (DMF), methanol, ethanol, glycol, nitromethane, acetonitrile, methoxyethanol, methyl cellosolve, and monoethyl ether. Specifically, DMSO may be used in the present invention.

In the PVDF solution according to the present invention, a PVDF concentration may be, specifically, 5 to 50 wt %, 10 to 40 wt %, or 15 to 35 wt %. When a PVDF concentration is within these ranges, it is possible to manufacture a piezoelectric element having excellent piezoelectric and ferroelectric properties.

In addition, the operation of preparing a PVDF solution may include stirring the solution, which was prepared by dissolving a PVDF powder in a solvent, on a hot plate at 50 to 150° C. for 0.5 to 5 hours. The stirring process may be performed, specifically, at a temperature of 60 to 110° C. for 1 to 3 hours.

In one exemplary embodiment, the operation of immersing the foam in the PVDF solution may include immersing the foam in the PVDF solution for 0.2 to 5 hours and progressing absorption. The immersing process may be performed, specifically, for 1 to 3 hours.

In addition, a drying operation may be further included after the immersing operation. The drying operation may be performed at 35 to 100° C. for 10 to 40 hours, specifically, at 50 to 90° C. for 15 to 30 hours. When the immersing operation in the PVDF solution and the drying operation are performed at the above temperature for the above time, it is possible to improve piezoelectric and ferroelectric properties.

In one exemplary embodiment, the operation of electrical polarization may include the operation of causing a phase transition of PVDF in a 3 kV high-voltage generator for 0.5 to 2 hours. When PVDF that is phase-transitioned through the operation of electrical polarization is β-phase, a piezoelectric property may be exhibited. In this case, a piezoelectric element may be a piezoelectric element. Also, when PVDF that is phase-transitioned through the operation of electrical polarization is δ-phase, a ferroelectric property may be exhibited. In this case, a piezoelectric element may be a ferroelectric element.

Through the method of manufacturing an electric element according to the present invention, a piezoelectric element or a ferroelectric element, which is a sponge type material having excellent elasticity, flexibility, and expansion and contraction properties and has excellent piezoelectric or ferroelectric properties, may be easily manufactured.

EXAMPLES

Hereinafter, the present invention will be described in more detail according to embodiments. However, the following embodiments are merely presented to exemplify the present invention, and the content of the present invention is not limited to the following embodiments.

Example 1

1) Manufacture of PDMS Sponge

A sugar-templating process was used to manufacture a PDMS sponge. The PDMS sponge was manufactured in a sugar cube-like form. Here, a particle size of the used sugar was about 450 First, sugar was immersed in a mixed solution of a PDMS prepolymer and a thermal curing agent (SYLGARD®184 commercially available from Dow Corning Corporation) having a volume ratio of 10:1 for 2 hours and absorption was progressed. Afterward, an absorber that was prepared through the immersing process was taken out and then cured on a hot plate at 60° C. for 24 hours. After the curing process, sugar was removed from the cured absorber in water at room temperature using ultrasonic disintegration, and then the resulting substance was air-dried for 24 hours to obtain a PDMS sponge.

2) Preparation of PVDF Solution

A PVDF powder was dissolved in dimethyl sulfoxide (DMSO) at a concentration of 10 wt % and the resulting substance was stirred on a hot plate at 90° C. for 2 hours to prepare a PVDF solution.

3) Manufacture of Piezoelectric Sponge

The PDMS sponge was immersed in the PVDF solution prepared in the above process for 2 hours and absorption was progressed. The resulting sponge was dried at 70° C. for 24 hours. A piezoelectric sponge thus dried was electrically polarized using a 3 kV high-voltage generator for 1 hour to cause a phase transition of PVDF, and as a result, a piezoelectric sponge including β-phase PVDF and having a height of 5 mm was manufactured. Here, an average pore diameter of the piezoelectric sponge was 400 μm.

Figure 1:
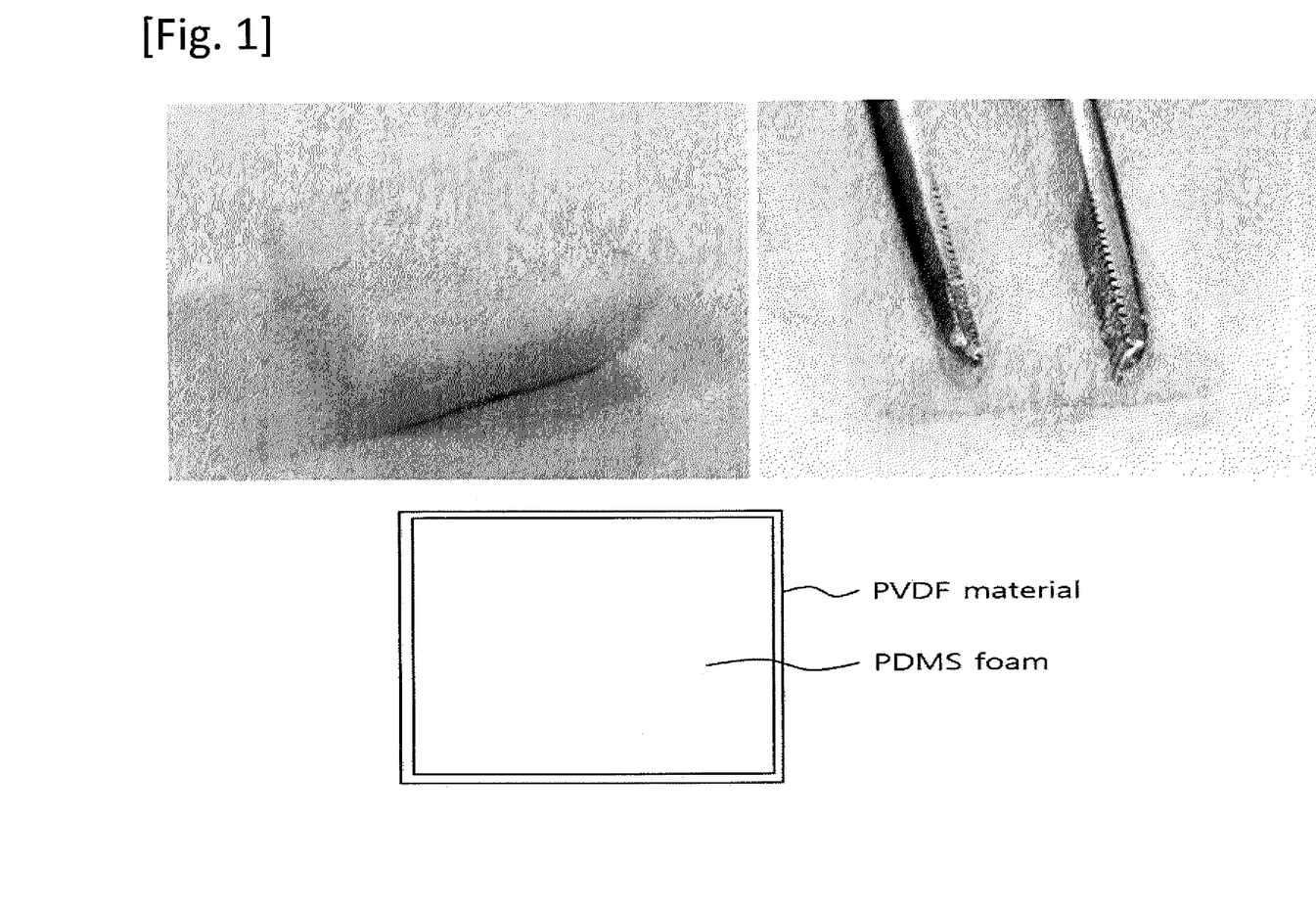
FIG. 1 is an image of a sponge element manufactured according to the present invention.

FIG. 1 is an image of a piezoelectric sponge manufactured in a sugar cube-like form according to the present invention.
FIG. 2 is a result of a Raman spectrum illustrating that PVDF of the piezoelectric sponge is phase-transitioned so as to become β-phase PVDF. It can be seen through this result that α-phase PVDF was converted to β-phase PVDF, which exhibits a piezoelectric property, by electrical polarization of PVDF and thus the piezoelectric sponge exhibits a piezoelectric property.

Example 2

A piezoelectric sponge was manufactured in the same manner as in Example 1 except that a PVDF powder was dissolved at a concentration of 15 wt % in the preparation of a PVDF solution. Here, an average pore diameter of the piezoelectric sponge was 400 μm.

Example 3

A piezoelectric sponge was manufactured in the same manner as in Example 1 except that a PVDF powder was dissolved at a concentration of 20 wt % in the preparation of a PVDF solution. Here, an average pore diameter of the piezoelectric sponge was 400 μm.

Example 4

1) Manufacture of PDMS Sponge
A PDMS sponge was manufactured in the same manner as in Example 1.
2) Preparation of PVDF Solution
A PVDF solution was prepared in the same manner as in Example 1.
3) Manufacture of Ferroelectric Sponge
The PDMS sponge was immersed in the PVDF solution prepared in the above process for 2 hours and absorption was progressed, and then the resulting sponge was dried at 70° C. for 24 hours. A ferroelectric sponge thus dried was electrically polarized using a 3 kV high-voltage generator for 1 hour to cause a phase transition of PVDF, and as a result, a ferroelectric sponge including δ-phase PVDF and having a height of 10 mm was manufactured.

FIG. 3 is a result of a Raman spectrum illustrating that PVDF of the ferroelectric sponge is phase-transitioned so as to become δ-phase PVDF. It can be seen through this result that α-phase PVDF was converted to δ-phase PVDF, which exhibits a ferroelectric property, by electrical polarization of PVDF and thus the ferroelectric sponge exhibits a ferroelectric property. Here, an average pore diameter of the ferroelectric sponge was 400 μm.

Example 5

A ferroelectric sponge was manufactured in the same manner as in Example 4 except that a PVDF powder was dissolved at a concentration of 15 wt % in the preparation of a PVDF solution. Here, an average pore diameter of the ferroelectric sponge was 400 μm.

Example 6

A ferroelectric sponge was manufactured in the same manner as in Example 4 except that a PVDF powder was dissolved at a concentration of 20 wt % in the preparation of a PVDF solution. Here, an average pore diameter of the ferroelectric sponge was 400 μm.

Experimental Example 1: Identification of Behaviors of Piezoelectric and Ferroelectric Elements According to Examples 1 to 6

Figure 4:
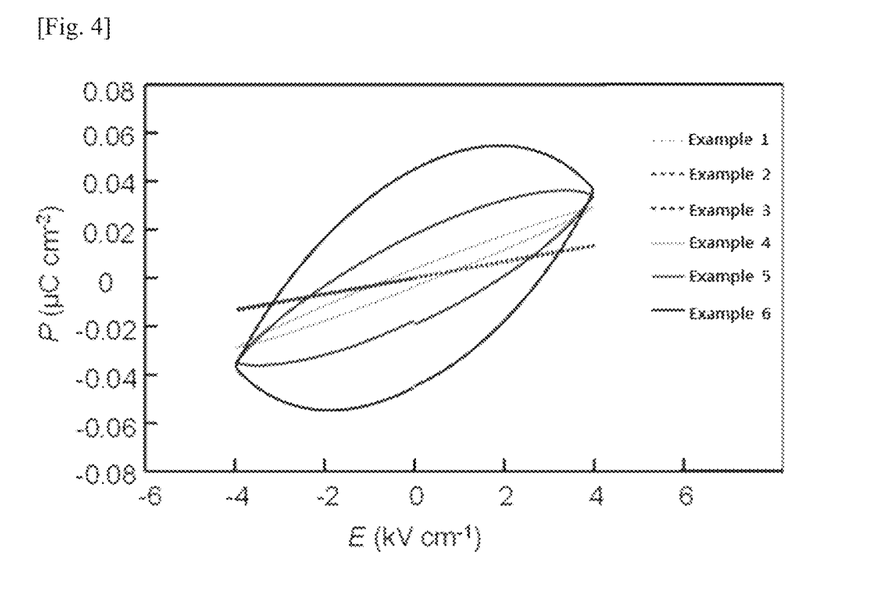
FIG. 4 illustrates P-E hysteresis loops in Examples 1 to 6 of the present invention.

In order to identify whether each of sponge elements according to Examples 1 to 6 is a piezoelectric element or a ferroelectric element, P-E hysteresis loop measurement was performed, results of which are shown in FIG. 4. In the case of Examples 1 to 3 in which β-phase PVDF was used for a piezoelectric sponge element, a ferroelectric property was not clearly exhibited, and thus respective values of remanent polarization were $10^{-5}$ to $10^{-4}$ μC/cm². On the other hand, in the case of Examples 4 to 6 in which δ-phase PVDF was used for a ferroelectric sponge element, values of remanent polarization were 0.00369 μC/cm², 0.0180 μC/cm², and 0.0450 μC/cm², respectively. Therefore, it can be seen that ferroelectric sponges according to Examples 4 to 6 exhibited typical ferroelectric polarization-electric field (P-E) hysteresis loops, and thus were typical ferroelectric elements that exhibit an increase in a polarization value as an electric field increases.

Figure 5:
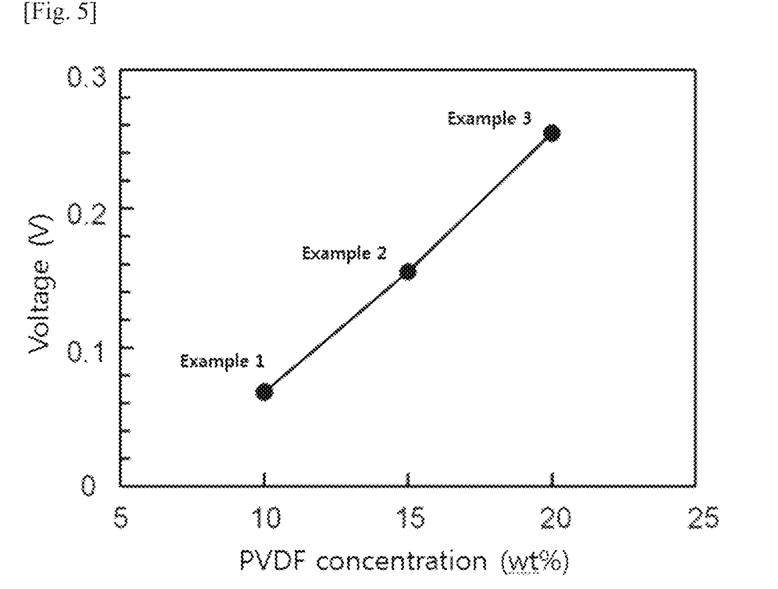
FIG. 5 is a graph illustrating a change in output voltage based on a PVDF concentration in Examples 1 to 3 of the present invention.

Experimental Example 2: Measurement of Output Voltage of Piezoelectric Sponge Based on PVDF Concentration Output voltage of a piezoelectric sponge element was measured based on an increase in a concentration of a PVDF solution. In the case of Examples 1 to 3 in which concentrations of PVDF solutions prepared by dissolving PVDF in dimethyl sulfoxide (DMSO) were 10 wt %, 15 wt %, and 20 wt %, respectively, output voltage values were measured. As a result, as shown in FIG. 5, output voltage values in Examples 1 to 3 were about 68 mV, 155 mV, and 254 mV, respectively. Therefore, it can be seen that output voltage increases as a concentration of a PVDF solution increases, and output voltage also increases as the thickness of a piezoelectric material applied on the surface of a piezoelectric sponge increases.

Experimental Example 3: Measurement of Output Voltage of Piezoelectric Sponge

Figure 6:
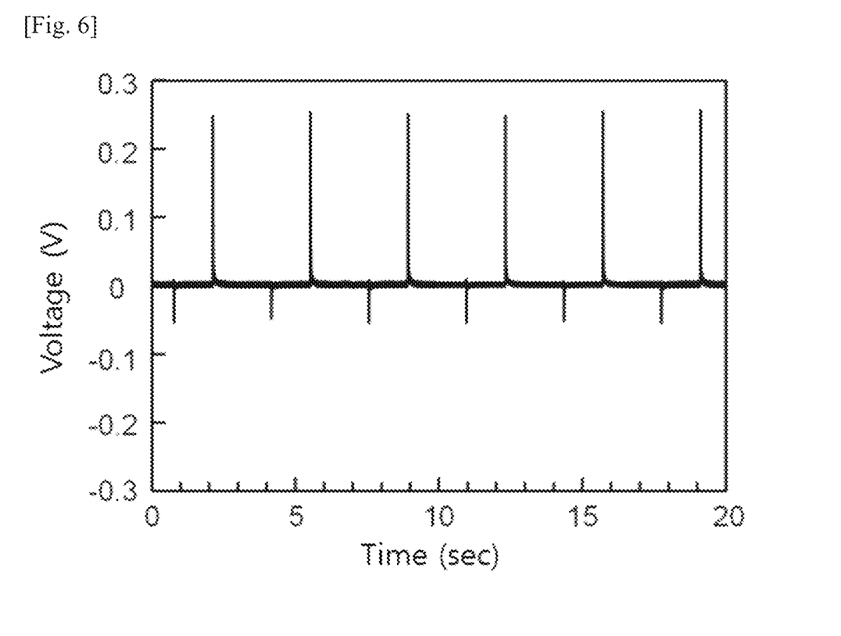
FIG. 6 is a graph illustrating a change in output voltage based on pressure in Example 3 of the present invention.

In order to evaluate output voltage of the piezoelectric sponge according to Example 3, a pushing test was repeated 20 times or more. As a result shown in FIG. 6, negative voltage was generated at the time of compressing the piezoelectric sponge and then disappeared, and positive voltage was generated when the piezoelectric sponge was restored to an original shape and then disappeared. Also, whenever voltage was generated, similar output voltage was generated. It can be seen that such an output method of voltage is the same as a typical output method of a piezoelectric element. In addition, it was confirmed that, in the case of Example 3 in which a 20 wt % PVDF solution was used for a piezoelectric sponge element, output voltage was about 254 mV.

Experimental Example 4: Measurement of Output Voltage of Piezoelectric Sponge Based on Depth to which Piezoelectric Sponge is Compressed Output voltage values were measured at varying depths to which the piezoelectric sponge according to Example 3 was compressed. As a result shown in FIG. 7, when the depths to which the piezoelectric sponge was compressed were about 0.7 mm, 1.0 mm, and 1.3 mm, output voltage values were about 125 mV, 250 mV, and 460 mV, respectively. Therefore, it can be seen that the more a piezoelectric sponge is compressed, the higher output voltage is.

Figure 8:
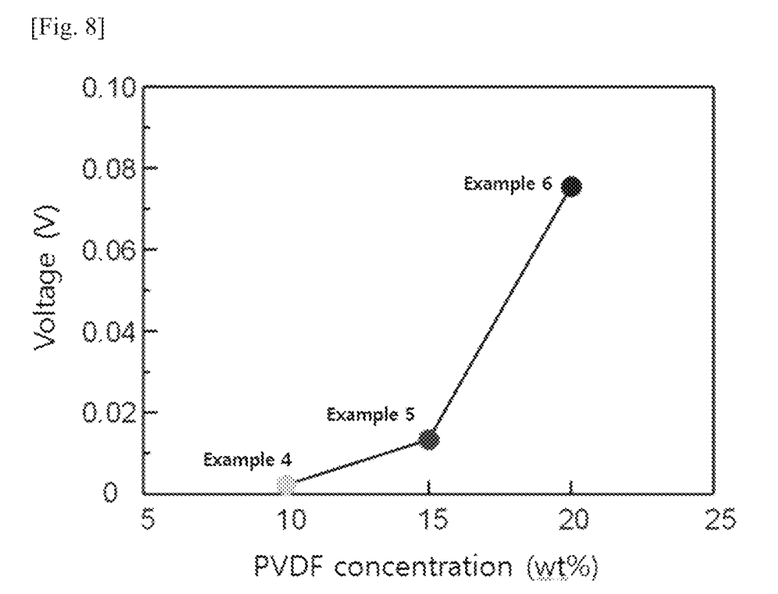
FIG. 8 is a graph illustrating a change in output voltage based on a PVDF concentration in Examples 4 to 6 of the present invention.

Experimental Example 5: Measurement of Output Voltage of Ferroelectric Sponge Based on PVDF Concentration Output voltage of a ferroelectric sponge element was measured based on an increase in a concentration of a PVDF solution. In the case of Examples 4 to 6 in which concentrations of PVDF solutions prepared by dissolving PVDF in dimethyl sulfoxide (DMSO) were 10 wt %, 15 wt %, and 20 wt %, respectively, output voltage values were measured. As a result, as shown in FIG. 8, output voltage values based on the concentrations were about 2.3 mV, 13 mV, and 76 mV, respectively. Therefore, it can be seen that output voltage increases as a concentration of a PVDF solution increases, and output voltage also increases as the thickness of a ferroelectric material applied on the surface of a ferroelectric sponge increases.

Experimental Example 6: Measurement of Output Voltage of Ferroelectric Sponge

Figure 9:
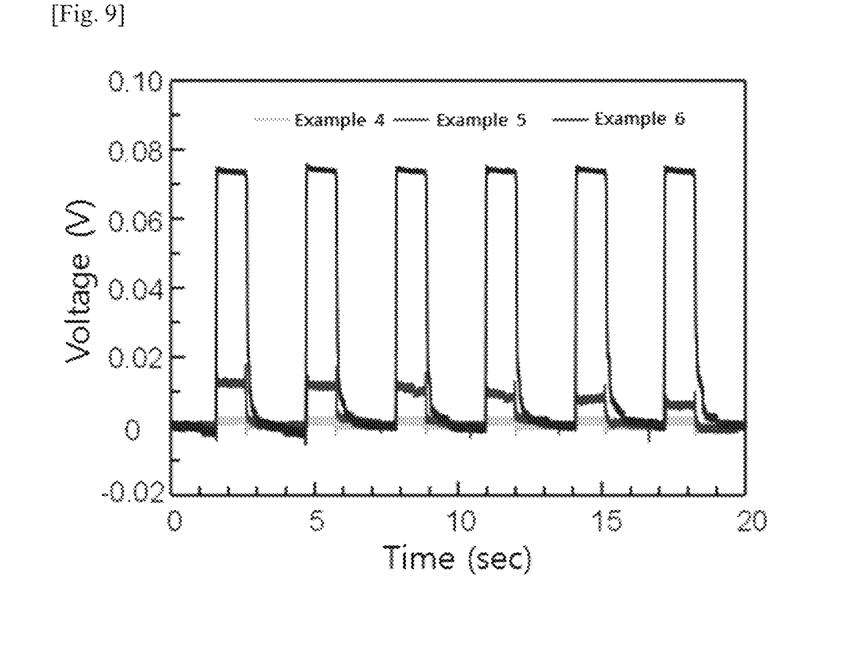
FIG. 9 is a graph illustrating a change in output voltage based on pressure in Examples 4 to 6 of the present invention.

In order to measure output voltage of a ferroelectric sponge, ferroelectric sponge elements having a ferroelectric property according to Examples 4 to 6 were used. As a result shown in FIG. 9, a ferroelectric sponge unlike a generally known piezoelectric sponge exhibits a phenomenon in which voltage was generated at the time of compressing a ferroelectric sponge, maintained, and disappeared at the time of restoring an original shape of the ferroelectric sponge. Such a behavior of voltage was a new discovery with respect to a behavior of a ferroelectric element that responds to pressure in a very specific manner. In the case of Example 6 in which a 20 wt % PVDF solution was used, output voltage of the ferroelectric sponge element was about 76 mV.

Experimental Example 7: Measurement of Output Voltage of Ferroelectric Sponge Based on Depth to which Ferroelectric Sponge is Compressed Output voltage values were measured at varying depths to which the ferroelectric sponge according to Example 6 was compressed. As a result shown in FIG. 10, when the depths to which the ferroelectric sponge was compressed were about 1 mm, 2 mm, and 3 mm, output voltage values were about 40 mV, 76 mV, and 86 mV, respectively. Therefore, it can be seen that the more a ferroelectric sponge is compressed, the higher output voltage is.

Experimental Example 8: Comparison of Capacitance Based on Pressure in Examples 3 and 6

Figure 11:
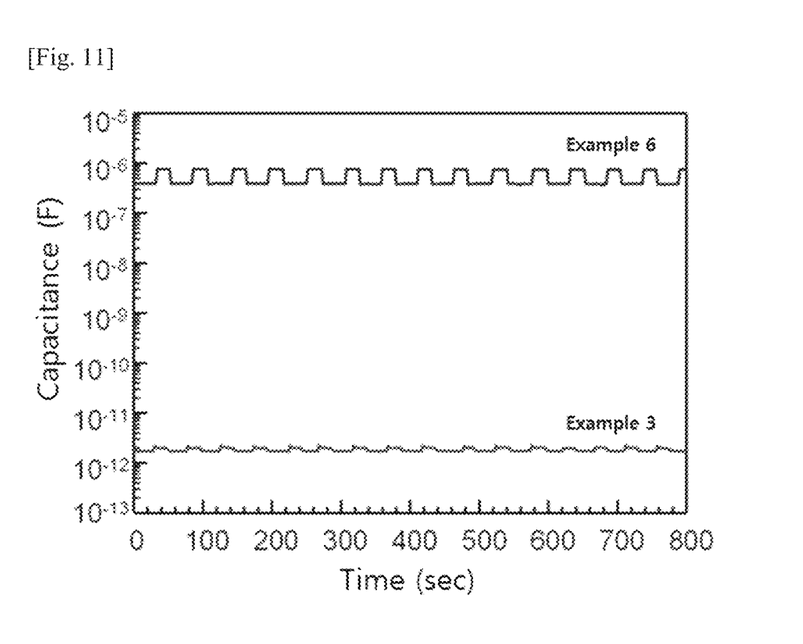
FIG. 11 is a graph illustrating a change in capacitance over time in response to pressure of a piezoelectric sponge element and a ferroelectric sponge element according to Examples 3 and 6 of the present invention.

Capacitances of the piezoelectric sponge element according to Example 3 and the ferroelectric sponge element according to Example 6 were compared based on pressure. A change in capacitance over time when 3 N pressure was applied was exhibited, the result of which is shown in FIG. 11. When not compressed, the ferroelectric sponge element manufactured using δ-phase PVDF according to Example 6 had a capacitance of 393 nF, but when the ferroelectric sponge element was compressed, the capacitance increased to 763 nF and was maintained. However, when not compressed, the piezoelectric sponge element manufactured using β-phase PVDF according to Example 3 had a capacitance of, 1.73 pF, which is 4.4×10$^{-4}$% of that of the ferroelectric sponge element manufactured using δ-phase PVDF. Also, when the piezoelectric sponge element was compressed, the capacitance thereof very slightly increased to 2.00 pF. Such a phenomenon strongly supports the fact that the ferroelectric sponge element manufactured using δ-phase PVDF according to Example 6 is a ferroelectric element having capacitance. That is, it can be seen that a phenomenon in which output voltage is increased and maintained is closely related to a change in capacitance. Also, it was confirmed that the piezoelectric sponge element manufactured using β-phase PVDF exhibits slight capacitance not because of β-phase PVDF but because of properties of PDMS.

Experimental Example 9: Measurement of Elastic Modulus in Examples 3 and 6

Elastic modulus values of the piezoelectric sponge according to Example 3 of the present invention and the ferroelectric sponge according to Example 6 of the present invention were measured. Samples having a size of 1.5 cm×1.5 cm×1 cm were measured at 25° C. In this case, a tensile testing machine (Instron 4206 commercially available from Instron Corporation) was used as a testing machine, the result of which is shown in the following Table 1.

TABLE 1

| Category | Example 3 | Example 6 |
|---|---|---|
| Elastic modulus (kPa) | 20 | 20 |

It was confirmed through the above result that the piezoelectric sponge and the ferroelectric sponge according to the present invention have an elastic modulus of 20 kPa and thus improved compressibility and flexibility may be implemented.

A piezoelectric element according to the present invention is provided in a sponge form, and thus can implement all of compressibility, flexibility, and durability and can be diversely applied to a wearable piezoelectric element, a ferroelectric element, and a sensor.

What is claimed is:

1. A piezoelectric element, comprising:
    a polydimethylsiloxane (PDMS) foam with a sponge structure; and
    a δ-phase polyvinylidene fluoride (PVDF) piezoelectric material applied on the surface of the foam,
    wherein the polydimethylsiloxane (PDMS) foam has an average pore diameter in a range of 10 to 1000 μm.

2. The piezoelectric element according to claim 1, wherein the piezoelectric element satisfies a condition of the following Expression 1:

$$1 \leq E_p \leq 1000 \quad \text{[Expression 1]}$$

wherein $E_p$ refers to an elastic modulus of a piezoelectric element (1.5 cm×1.5 cm×1 cm) measured at 25±2° C., and a unit thereof is kPa.

3. A method of manufacturing a piezoelectric element according to claim 1, comprising:
    preparing a polydimethylsiloxane (PDMS) foam with a sponge structure;
    preparing a δ-phase polyvinylidene fluoride (PVDF) solution;
    immersing the foam in the δ-phase polyvinylidene fluoride (PVDF) solution; and
    performing electrical polarization.

4. The method according to claim 3, wherein the operation of preparing a polydimethylsiloxane (PDMS) foam with a sponge structure includes performing a templating process.

5. The method according to claim 3, wherein the operation of preparing a δ-phase polyvinylidene fluoride (PVDF) solution includes dissolving a δ-phase polyvinylidene fluoride (PVDF) powder in a solvent at a concentration of 5 to 50 wt %.

6. The method according to claim 3, wherein the operation of performing electrical polarization includes causing a phase transition of polyvinylidene fluoride (PVDF) in a 3 kV high-voltage generator for 0.5 to 2 hours.

* * * * *